United States Patent
Hsu et al.

(10) Patent No.: US 8,447,544 B2
(45) Date of Patent: May 21, 2013

(54) METHOD AND APPARATUS FOR DETECTING STATE OF CHARGE OF BATTERY

(75) Inventors: Yueh-Teng Hsu, Taipei (TW); Chia-Fu Yeh, Jhubei (TW)

(73) Assignee: Lite-On Clean Energy Technology Corp., Taipei (TW)

( * ) Notice: Subject to any disclaimer, the term of this patent is extended or adjusted under 35 U.S.C. 154(b) by 360 days.

(21) Appl. No.: 13/017,355

(22) Filed: Jan. 31, 2011

(65) Prior Publication Data

US 2012/0072146 A1 Mar. 22, 2012

(30) Foreign Application Priority Data

Sep. 21, 2010 (CN) .......................... 2010 1 0288745

(51) Int. Cl.
  *G01R 31/36* (2006.01)
  *G01R 13/00* (2006.01)
(52) U.S. Cl.
  USPC .............. 702/63; 320/134; 320/136; 702/64; 702/66

(58) Field of Classification Search
  USPC .... 702/60, 63–66, 71, 73, 124, 126; 320/134, 320/136, 430
  See application file for complete search history.

(56) References Cited

U.S. PATENT DOCUMENTS

| | | | | |
|---|---|---|---|---|
| 3,946,299 A | * | 3/1976 | Christianson et al. | 324/430 |
| 4,258,306 A | * | 3/1981 | Bourke et al. | 320/134 |
| 6,160,382 A | * | 12/2000 | Yoon et al. | 320/136 |

* cited by examiner

*Primary Examiner* — John H Le
(74) *Attorney, Agent, or Firm* — Rabin & Berdo, P.C.

(57) ABSTRACT

A method for detecting a state of charge (SOC) of a battery is disclosed. The method includes inputting a pulse to the battery for receiving a response curve of the battery associated with the pulse inputted to the battery, determining a set of parameters for preparing a simulated curve, comparing a difference between the response curve and the simulated curve, determining whether the difference between the simulated curve and the response curve is less than a predetermined threshold before further utilizing the parameters to determine the SOC from a corresponding relationship.

17 Claims, 4 Drawing Sheets

METHOD AND APPARATUS FOR DETECTING STATE OF CHARGE OF BATTERY

BACKGROUND OF THE INVENTION

1. Field of the Invention

The present invention relates to a detection method and apparatus; in particular, to a method and apparatus for detecting the state of charge (SOC) of a battery.

2. Description of Related Art

In order to ensure safe operations of a battery, over-charge or over-discharge should be prevented to protect the battery from irreversible change of electrochemical characteristic inside the battery which deteriorates the performance and lowers the lifespan of the battery. Therefore, in order to avoid over-charge or over-discharge, the processes of charging or discharging must be stopped before the battery reaches its upper limit of charging capacity or the lower limit of discharging capacity. Consequently, by measuring the state of charge (SOC) of the battery, the change of the electrochemical characteristic of the battery could be monitored during battery charge/discharge processes to ensure that the battery is being used in a safe range.

However, the state of charge of a battery is affected by numerous factors, such as the history of charge/discharge operations, types of the battery (using different active materials), or the internal architecture of the battery. Hence, several methods measuring the SOC have been proposed in which the SOC of the battery may be obtained by means of detecting parameters varying along with the changes in the SOC of the battery. Those methods include: discharge test, electrolyte concentration measuring, coulomb/ampere hour counting, loaded voltage measuring, internal resistance measuring, open circuit voltage measuring, electrochemical impedance spectroscopy, and so forth.

However, the conventional measuring methods are associated with their disadvantages. For example, the open circuit voltage measuring method firstly open-circuits the battery and awaits the battery to its equivalent state (depolarized state), in which the relationship between the SOC of the battery and the open-circuit voltage is linear in a certain range (operation range), as shown in FIG. 1. According to FIG. 1, within an operating range S1 where the linear relationship exists for the SOC of the battery and the open-circuit voltage, the current SOC may be obtained by measuring the open-circuit voltage. Although the open circuit voltage measuring is relatively simpler, the measuring may take too much time in remaining the battery stationary to reach an equivalent state. Also, the open-circuit voltage method may be not accurate for those batteries whose open-circuit voltage changes comparatively small with the SOC (e.g., a lithium iron phosphate battery).

In addition, the electrochemical impedance spectroscopy measuring method is to provide multiple sets of waveforms of different frequencies to the battery and read the responded waveforms from the battery for analysis, and then parameters presenting different SOCs can be obtained. This method consumes excessively long time on collecting relevant parameters and corresponding computations are complicated when the issue of the polarization of the battery is taken into consideration. Meanwhile, the equipments implementing such measuring method are expensive and the entire measuring process needs to be accomplished offline, all of which can not fulfill the demands for general battery management systems.

SUMMARY OF THE INVENTION

The present invention provides a method and an apparatus for detecting state of charge (SOC) of a battery which enables fast and precise SOC measurements in the battery, and the required measuring components thereof can be directly installed on the battery set management system thereby facilitating convenient SOC measurements.

According to an embodiment of the present invention, a method for detecting the SOC of the battery includes the steps of: (a) inputting a pulse to the battery to measure a response curve of the battery associated with the pulse; (b) determining a set of parameters of the battery; (c) calculating a simulated curve of the battery associated with the pulse according to the set of the parameters, (d) comparing a difference between the simulated curve and the response curve to a predetermined threshold; (e) when the difference is not less than the predetermined threshold returning to STEP (b), and (f) otherwise, querying a corresponding relationship according to the set of the parameters so as to determine the SOC of the battery. The corresponding relationship indicates a correspondence between the SOC of the battery and a resistance of a charge transfer resistor of the battery.

The pulse width of the pulse inputted to the battery is less than or equal to 10 milliseconds (ms) and the height thereof is less than or equals to 2 amperes.

The resistance of the charge transfer resistor in the set of the parameters may be used to determine the SOC of the battery based on the corresponding relationship.

According to another embodiment of the present invention, an apparatus for detecting the SOC of the battery is provided. The apparatus includes a pulse generator, an analog/digital converter and a controller. The pulse generator outputs a pulse to the battery. The analog/digital converter detects an outputted voltage of the battery. The controller is coupled to the pulse generator and the analog/digital converter, which controls the pulse generator to output the pulse, measures the response curve of the battery associated with the pulse through the analog/digital converter, wherein the controller calculates a simulated curve of the battery associated with the pulse, and determines whether a difference between the simulated curve and the response curve is larger than a predetermined threshold.

The calculations of the aforementioned simulated curve are performed by determining the parameters of the battery conjunctively with the pulse. The controller is configured to utilize the parameters to query a corresponding relationship in order to determine the SOC of the battery, while the corresponding relationship records a correspondence between the SOC of the battery and a resistance of charge transfer resistor of the battery.

Consequently, through the technical solutions set forth as above, in the present invention only the pulse of a single frequency is needed to receive the waveform associated with the pulse from the battery, and through subsequent calculations, and converge to the parameters associated with the simulated curve with the difference between the simulated curve and the response curve less than the predetermined threshold. By doing so, the SOC of the battery may be obtained. Therefore, the components required for the present detecting method can be conveniently implemented, enabling rapid measurement without the battery remaining stationary for a long period. Furthermore, complicated calculations can be effectively eliminated and the obtained parameters can be free from interferences caused by the polarization effect in the battery which may adversely affect the accuracy of the SOC measurement.

The summary illustrated hereinbefore as well as detailed descriptions and appended drawings set forth in the following texts are all for further explaining the approaches, means and effects taken by the present invention. Other objectives and

DETAILED DESCRIPTION OF THE PREFERRED EMBODIMENTS

Figure 1:
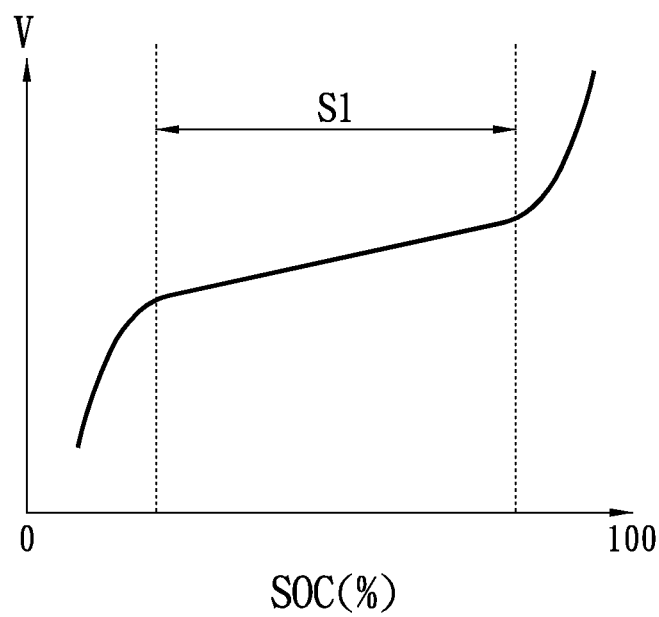
FIG. 1 shows a diagram of a corresponding curve between the open circuit voltage and the state of charge (SOC) of a battery in related art.
Figure 2:
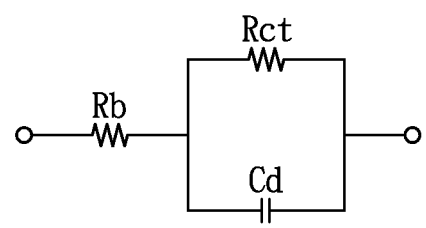
FIG. 2 shows an equivalent circuit diagram of a general battery.
Figure 3:
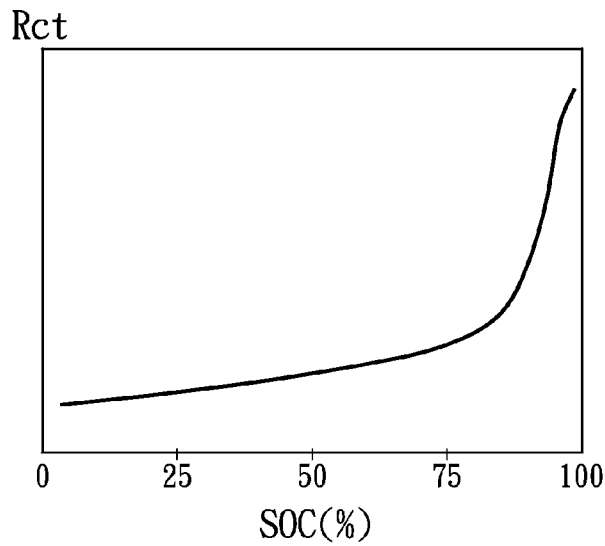
FIG. 3 shows a curve of a corresponding relationship between the resistance of the charge transfer resistor and the SOC.

Before further explaining the present invention, please refer to FIG. 2 in which an equivalent circuit diagram of a general battery is shown. The general battery may at least include a bulk resistor (Rb), a charge transfer resistor (Rct) and an electric double layer capacitor (Cd). A relationship exists correspondingly between the charge transfer resistor and the SOC, as shown in FIG. 3, where the above-mentioned corresponding relationship in terms of a curve is illustrated. FIG. 3 shows that the different charge transfer resistors may correspond to different SOC values. Therefore, the SOC of battery can be effectively located through the curved corresponding relationship shown in FIG. 3 if the resistance of the charge transfer resistor in the battery could be determined.

The technical features applied in the present invention are characterized in inputting a pulse to a battery thereby measuring and receiving a set of parameters according to the equivalent circuit of the battery shown in FIG. 2. As such, the specific parameter such as the charge transfer resistor may be obtained before the SOC of the battery may be determined by a lookup table or a functional relationship based on the corresponding relationship shown in FIG. 3.

The parameters in the aforementioned battery model may have the follow relationship:

$$Vo = Rb \times Ib + Rct \times Ib \times (1 - \exp(-t/\tau)); \tau = Rct \times Cd$$

where Vo indicates a battery voltage, Ib is the height of the inputted pulse and t is the pulse width of the inputted pulse.

Examples will be illustrated hereunder to explain the approach to determine the SOC of the battery through the charge transfer resistor.

Figure 4:
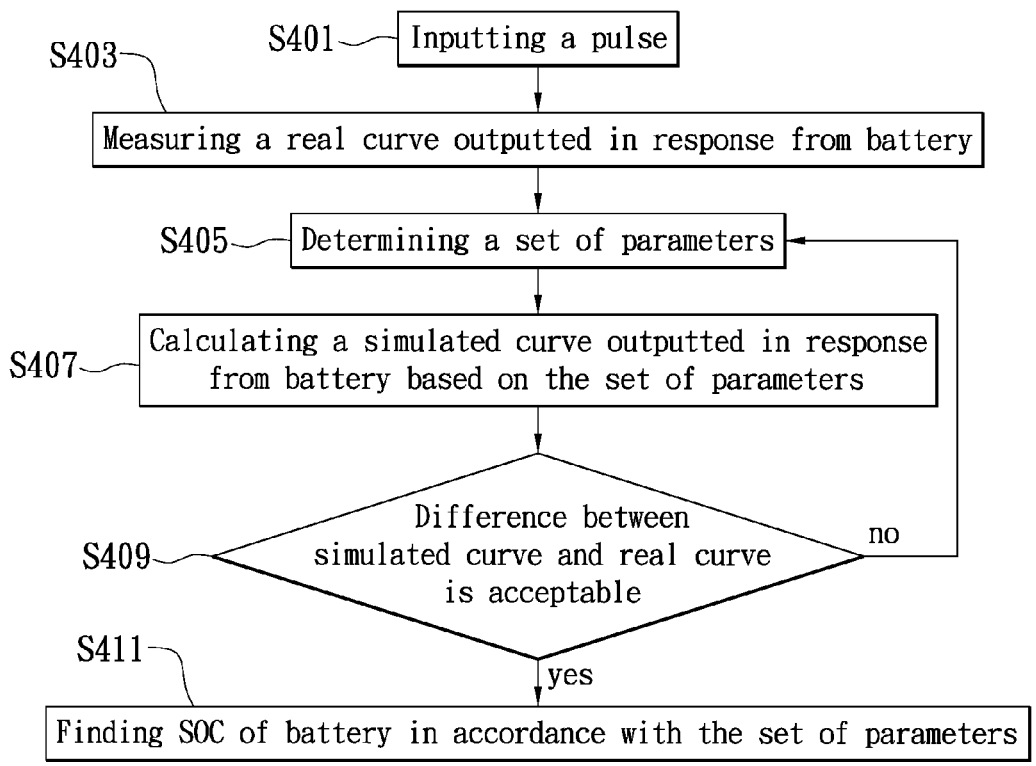
FIG. 4 shows a flowchart of a method for determining the SOC according to an embodiment of the present invention.

Refer now to FIG. 4, which illustrates a flowchart of a method for determining the SOC according to an embodiment of the present invention. The method for determining/measuring the SOC may be implemented by means of a programmable controller so as to control relevant electrical components to perform the following SOC determination/measuring on the battery.

Figure 5:
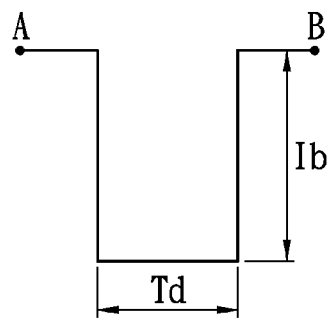
FIG. 5 shows one embodiment of the pulse inputted to the battery to be measured according to the present invention.

The pulse is inputted to a battery (S401) so that the parameters of the battery may be obtained for subsequent calculations. To prevent polarization effect of the battery from causing inaccuracy in the following SOC detection operations, the pulse provided may be as shown in FIG. 5 in which one embodiment of the pulse inputted to the battery according to the present invention is shown. The pulse width of the inputted pulse (Td) is less than or equal to 10 ms, and the height of the pulse (Ib) is less than or equal to 2 amperes. It should be noted that the values set forth in relation with the pulse width of the pulse and the height thereof pulse are exemplary rather than limiting the scope of the present invention.

When the battery receives the pulse, the controller may receive a response curve outputted from the battery (S403). And the response curve is associated with the pulse inputted to the battery, and represents an outputted voltage of the battery.

Thereafter, the controller determines the set of the parameters of the battery (S405) thereby preparing a simulated curve before comparing the simulated curve with the response curve. The parameters may be in terms of the circuit components in the equivalent circuit model of the battery. For example, the parameters may include the resistance of a bulk resistor (Rb), the resistance of a charge transfer resistor (Rct), and the capacitance of an electric double layer capacitor (Cd).

After determining the parameters, the controller may prepare the simulated curve associated with the pulse by the battery (S407). The detailed internal calculation processes executed by the controller for the preparation of the simulated curve will be further described in the following texts.

Therefore, after the preparation of the simulated curve by the controller, the controller is further configured to compare the simulated curve with the response curve and determines whether a difference between the simulated curve and the response curve is larger than a predetermined threshold (S409). The determination on whether the difference between these two curves falls within an acceptable range is well-known to those skilled ones in the relevant field and herein omitted for purpose of clarity. The objective of the comparison is to decide whether the parameters identified in S405 are indeed sufficiently close to the circuit parameters in the actual battery.

In case the determination in S409 is negative (e.g., the difference between two curves is larger than the predetermined threshold), the parameters applied in the preparation of the simulated curve by the controller may not be considered as internal circuit parameters of the actual battery. As such, the method may return to S405 to determine another set of parameters. So, through repeating S405~S409 the method may undergo recursive operations until the difference between a simulated curve based on a certain set of the parameters and the response curve is less than the predetermined threshold, which means the determination in S409 is positive.

Figure 6:
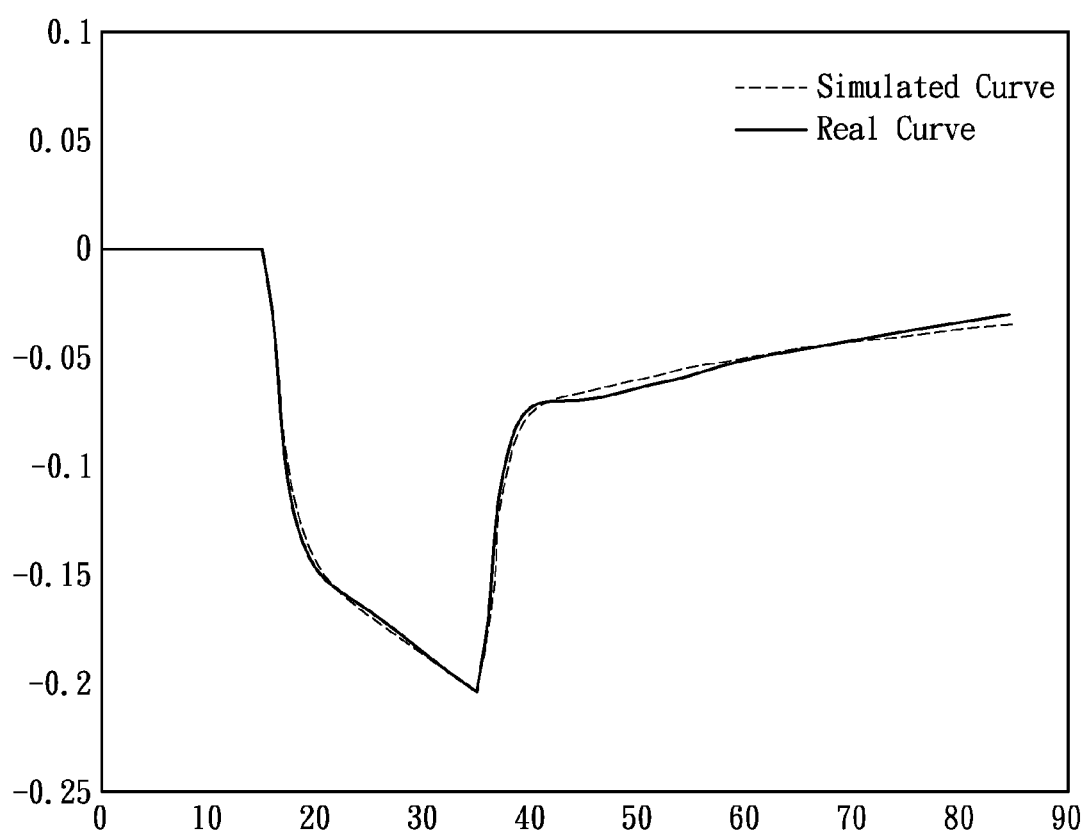
FIG. 6 show a schematic diagram in which the difference between the response curve and the simulated curve is less than the predetermined threshold, in accordance with the present invention.

When the determination in STEP S409 is positive, indicating the parameters utilized in the preparation of the simulated curve by the controller have been considered as the internal circuit parameters of the actual battery, as shown in FIG. 6 in which the difference between the simulated curve and the response curve is less than the predetermined threshold is shown. More specifically, the solid line indicates the response curve and the dotted line represents the simulated curve, with such two lines being closely overlapped. Therefore, the SOC of the battery may be determined based on the resistance of Rct of the charge transfer resistor through the corresponding relationship shown in FIG. 3 (S411).

Regarding S403, the determination of the parameters may select different initial values based on various types of the batteries when the simulated curve is prepared for the first time. Different combinations of the parameters may be applied depending on whether the difference between the simulated curve and the real curve, in order to ensure that the updated simulated curves could be approaching to the response curve. In one implementation, a curve approximation method is herein applied to prepare the simulated curve while other methods may be in place to serve the same purpose. In another implementation, the parameters may be previously recorded to be chosen from at the time of the preparation of the simulated curve.

Furthermore, the corresponding relationship between the charge transfer resistor and the SOC may be previously established in terms of the lookup table or the functional relationship. In addition, before S411 is performed the method according to one embodiment of the present invention may further include the step of utilizing the corresponding lookup table or functional relationship based on detecting a temperature of the battery whose SOC is to be measured. In doing so, the method may improve the accuracy of the SOC.

Figure 7:
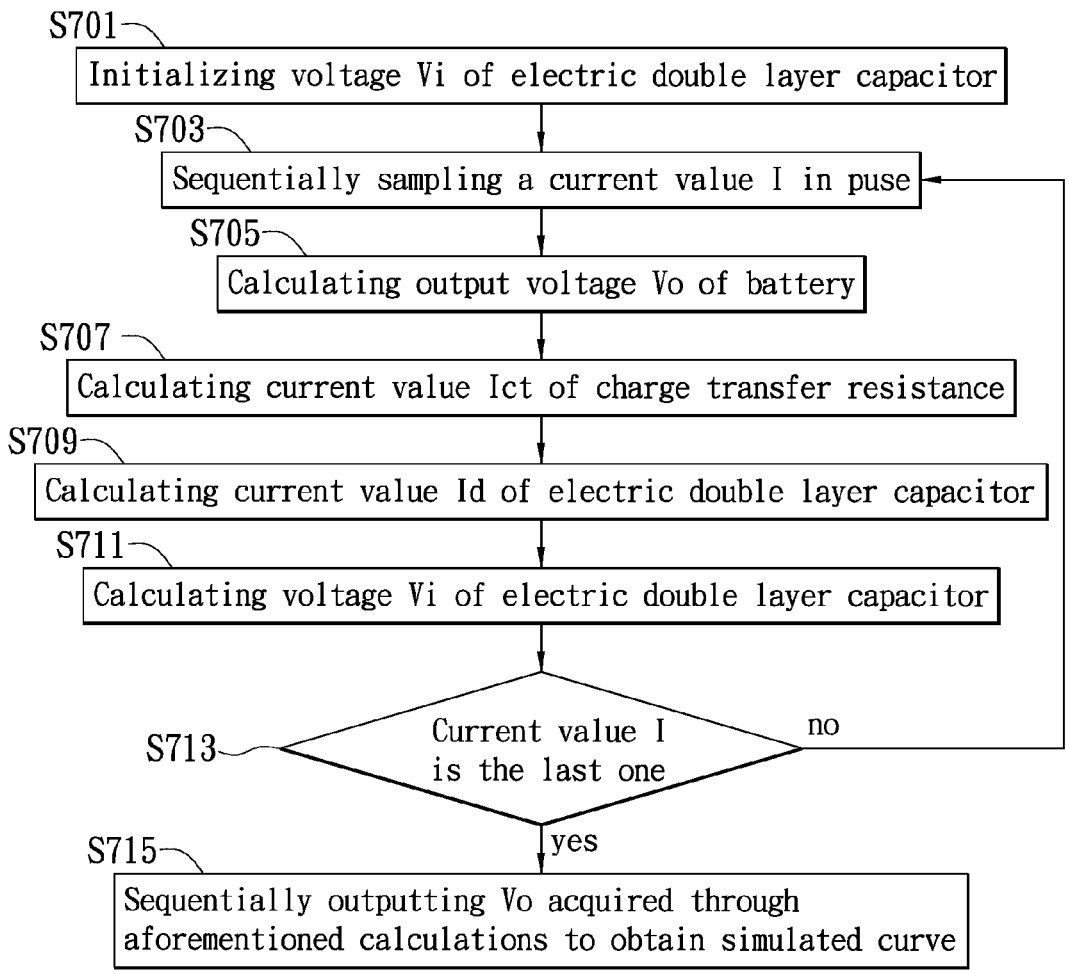
FIG. 7 shows a flowchart for calculations of the simulated curve according to an embodiment of the present invention.

Regarding S407 previously illustrated in FIG. 4, please also refer to FIG. 7 wherein a flowchart for calculations of the simulated curve according to an embodiment of the present invention is shown. The calculation/preparation includes:

initializing the voltage Vi of the electric double layer capacitor and setting the initial voltage to zero (S701);

recording a current value I of the inputted pulse (S703), wherein the sampling starts from a sampling time point A of the pulse shown in FIG. 5 to a sampling time point B;

calculating the outputted voltage V0 of the battery (S705), which is obtained based on the equation Vo=I×Rb+Vi;

calculating the current value Ict of the charge transfer resistor (S707), which is obtained based on the equation Ict=Vi÷Rct;

calculating the current value Id of the electric double layer capacitor (S709), which is obtained based on the equation Id is I–Ict;

calculating the voltage Vi of the electric double layer capacitor (S711), which is obtained based on Vi=Vi+Id÷Cd (Vi on the right side of the equation stands for Vi obtained in the preceding sampling point) with Cd indicating the capacitance of the electric double layer capacitor;

determining whether the current value I of the sampling pulse corresponds to the final sample in the pulse (i.e., the current value I is the current value of the sample point B of the pulse) (S713);

if the determination in S713 is NO, then returning to S703; and if the determination in S713 is YES, then sequentially outputting the outputted voltages (Vo) at each of the aforementioned samplings in order to obtain a simulated curve (S715).

Herein it should be specifically noted that the calculation method of simulated curve disclosed as above is merely exemplary, rather than for limiting the scope of view of the present invention. The present invention may be also implemented by means of other calculation methods so as to get the desired simulated curve.

Figure 8:
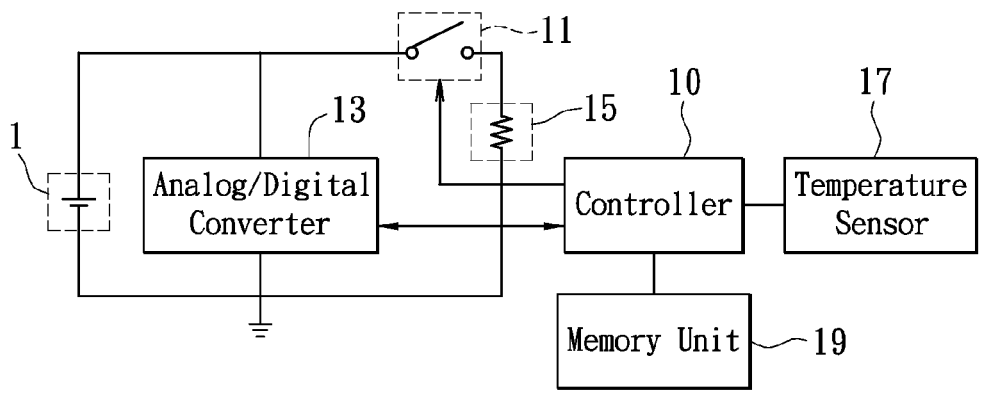
FIG. 8 shows a block diagram of an apparatus for detecting/measuring the SOC according to an embodiment of the present invention.

Refer next to FIG. 8, which illustrates a block diagram of an apparatus for detecting/measuring the SOC according to an embodiment of the present invention. The apparatus comprises a controller 10, a pulse generator 11, a current limit unit 15, an analog/digital converter 13, a temperature sensor 17 and a memory unit 19.

The controller 10 is configured to ensure the pulse generator 11 to provide an inputted pulse with the battery. The pulse generator 11 may be a switch which is coupled between the battery 1 and a ground. When the switch is conducted (or turned on), the battery 1 may be discharged to the ground generating a discharging pulse. In another implementation, the pulse generator 11 may be embodied by other electrical components, and may provide a charging pulse with the battery 1 rather than being limited to the provision of the discharging pulse.

The current limit unit 15 is connected with the pulse generator 11 in order to control the current value of the pulse provided by the pulse generator 11 to fall within a predetermined range. In one implementation, the predetermined range may be less than or equal to 2 amperes. It is worth noting that the current limit unit 15 may be a resistor.

The analog/digital converter 13, which is controlled by the controller 10, performs measurements on the battery 1 and converts the measured analog voltage on the battery 1 into a digital counterpart for further determination process in the controller 10.

The temperature sensor 17 detects the temperature in the battery 1 and outputs the detected result to the controller 10.

The memory unit 19 may record relevant data for use by the controller 10. For example, the memory unit 19 may record the corresponding relationship between the charge transfer resistor and the SOC of the battery 1 under different temperatures. The corresponding relationship may be in terms of a lookup table or a functional relationship equation, and also records multiple sets or combinations of the parameters for the calculation of the simulated curve.

Herein the measurement of SOC by the controller 10 is performed based on internal program codes. The internal program codes enable the controller 10 to control the pulse generator 11, the analog/digital converter 13, the temperature sensor 17 and the memory unit 19.

Consequently, the controller 10 may generate the pulse shown in FIG. 5 through having the pulse generator 11 turned on and off. For example, by controlling the conducting time of the switch to be less than or equal to 10 ms associated with the current limit unit 15, the controller 10 may generate the current pulse (Ib) of the pulse height less than or equal to 2 amperes. Besides, the controller 10, together with the analog/digital converter 13, may determine the response curve of the battery 1 associated with the inputted pulse.

The controller 10 may further determine the simulated curve after the parameters of the battery 1 are determined. The parameters along with the current value of the inputted pulse may be utilized into the equivalent circuit model of the battery for the determination of the outputted voltages of the battery 1. Such multiple outputted voltages may represent the simulated curve.

As a result, the controller 10 is configured to determine the simulated curves on basis of different sets of the parameters so that for the simulated curves may be approaching the response curve. When the difference between the simulated curve arising out of a particular set of the parameters and the response curve is within the predetermined threshold (e.g., part of the simulated curve may have been overlapping the response curve), the SOC of the battery 1 may be determined based on that particular set of the parameters. For example, the resistance Rct of the charge transfer resistor as one parameter associated with the simulated curve with the difference to the response curve less than the predetermined threshold may be used to determine the SOC of the battery 1 according to the corresponding relationship between the charge transfer resistor and the SOC stored in the memory unit 19.

Hence, through the aforementioned descriptions, the present invention may proceed to determine the SOC without waiting for the battery to enter into a steady state. More specifically, the present invention may determine the SOC by directly inputting the pulse into the battery in any condition, and thus could be conducting the measurement of the SOC in a more prompt fashion.

In addition, in receiving the internal parameters of the battery, the present invention may effectively minimize the interference as the result of the polarization at the time of charging/discharging of the battery by inputting the pulse of high frequencies (e.g., 100 Hz) to reduce the interference generated by constant phase elements in the equivalent model of the battery. Consequently, the SOC measurement according to the present invention could be relatively accurate.

Furthermore, the measurement in the present invention does not require the waveform generator to generate multiple sets of waveforms at different frequencies in the conventional electrochemical impedance spectroscopy approach. Rather, the present invention only requires a switching element with the on/off states thereof controlled for the generation of the pulse of the single frequency before the necessary information for analyses of the equivalent circuit model of the battery could be obtained. Hence the measurement architecture according to the present invention is associated with the simplified features and reduced costs in the absence of the waveform generator.

The drawings and descriptions disclosed supra set forth simply the embodiments of the present invention. All changes, alternations, or modifications conveniently considered by those skilled in the art are deemed to be encompassed within the scope of the present invention delineated by the following claims.

What is claimed is:

1. A method for detecting a state of charge (SOC) of a battery, comprising the steps of:
   (a) inputting a pulse to the battery to measure a response curve of the battery associated with the pulse;
   (b) determining a set of parameters of the battery;
   (c) calculating a simulated curve of the battery associated with the pulse according to the set of the parameters;
   (d) comparing a difference between the simulated curve and the response curve to a predetermined threshold;
   (e) when STEP (d) determines the difference is larger than the predetermined threshold, returning to STEP (b); and
   (f) otherwise, querying a corresponding relationship according to the set of the parameters so as to determine the SOC of the battery, in which the corresponding relationship records a correspondence between the SOC of the battery and a resistance of a charge transfer resistor (Rct) of the battery.

2. The method for detecting the state of charge (SOC) of the battery according to claim 1, wherein, in STEP (b), the set of the parameters is consisted of a resistance of a bulk resistor (Rb), the resistance of the charge transfer resistor (Rct) and a capacitance of an electric double layer capacitor (Cd).

3. The method for detecting the state of charge (SOC) of the battery according to claim 2, wherein a pulse width of the pulse is less than or equal to 10 milliseconds (ms).

4. The method for detecting the state of charge (SOC) of the battery according to claim 2, wherein a height of the pulse is less than or equal to 2 amperes.

5. The method for detecting the state of charge (SOC) of the battery according to claim 2, wherein STEP (a) comprises grounding the battery through a switch and controlling a conducting time of the switch by a controller to input the pulse to the battery.

6. The method for detecting the state of charge (SOC) of the battery according to claim 5, wherein the controller converts an outputted voltage of the battery associated with the pulse into the response curve through an analog/digital converter.

7. The method for detecting the state of charge (SOC) of the battery according to claim 2, wherein STEP (c) comprises:
   (c1) initializing a voltage Vi of the electric double layer capacitor as zero;
   (c2) recording a current value I of the pulse;
   (c3) calculating the outputted voltage Vo of the battery by I×Rb+Vi;
   (c4) calculating a current value Ict flowing through the charge transfer resistor, wherein Ict=Vi÷Rct;
   (c5) calculating a current value Id flowing through the electric double layer capacitor, wherein Id=I−Ict;
   (c6) calculating the voltage Vi of the electric double layer capacitor, wherein Vi is calculated by Vi+Id÷Cd from a preceding sampling point;
   (c7) determining whether the current value I corresponds to the final sample in the pulse;
   (c8) when STEP (c7) is NO returning to STEP (c2); and
   (c9) otherwise sequentially outputting the outputted voltage Vo of STEP (c3) to obtain the simulated curve.

8. The method for detecting the state of charge (SOC) of the battery according to claim 2, wherein STEP (f) determines the SOC of the battery from the corresponding relationship based on the resistance Rct of the charge transfer resistor in the set of the parameters, and, in STEP (f), the corresponding relationship is created based on a lookup table or a functional relationship.

9. The method for detecting the state of charge (SOC) of the battery according to claim 8, further comprising a step of measuring a temperature of the battery before STEP (f) to query the corresponding relationship associated with the temperature.

10. The method for detecting the state of charge (SOC) of the battery according to claim 1, wherein STEPS (b), (c), and (d) are performed by a curve approximation method.

11. An apparatus for detecting state of charge (SOC) of a battery, comprising:
   a pulse generator, which outputs a pulse to the battery;
   an analog/digital converter, which detects the battery; and
   a controller coupled to the pulse generator and the analog/digital converter, wherein the controller controls the pulse generator to output the pulse and measures a response curve of the battery associated with the pulse through the analog/digital converter, wherein the controller calculates a simulated curve of the battery associated with the pulse and determines whether a difference between the simulated curve and the response curve is larger than a predetermined threshold;
   wherein the simulated curve is determined according to a set of parameters of the battery associated with the pulse, the controller determines the SOC of the battery with the set of the parameters by querying a corresponding relationship, and the corresponding relationship records a correspondence between the SOC of the battery and a resistance of a charge transfer resistor of the battery.

12. The apparatus for detecting the state of charge (SOC) of the battery according to claim 11, wherein the set of the parameters is consisted of a resistance of the bulk resistor (Rb), the resistance of the charge transfer resistor (Rct) and a capacitance of an electric double layer capacitor (Cd).

13. The apparatus for detecting the state of charge (SOC) of the battery according to claim 12, wherein the controller determines the SOC of the battery from a lookup table based on the resistance Rct of the charge transfer resistor wherein the corresponding relationship is established based on the lookup table.

14. The apparatus for detecting the state of charge (SOC) of the battery according to claim 12, wherein the pulse generator is a switch coupled between the battery and a ground.

15. The apparatus for detecting the state of charge (SOC) of the battery according to claim 14, wherein the controller controls a conducting time of the switch thereby allowing a pulse width of the pulse to be less than or equal to 10 milliseconds.

16. The apparatus for detecting the state of charge (SOC) of the battery according to claim 14, further comprising a current limit unit connected to the switch and controls a current flowing through the battery to be less than or equal to 2 Amperes.

17. The apparatus for detecting the state of charge (SOC) of the battery according to claim 11, wherein the controller calculates the simulated curve based on a curve approximation method.

\* \* \* \* \*